US008716153B2

(12) United States Patent
Lerch et al.

(10) Patent No.: US 8,716,153 B2
(45) Date of Patent: May 6, 2014

(54) DEVICE AND METHOD FOR PRODUCING DIELECTRIC LAYERS IN MICROWAVE PLASMA

(75) Inventors: Wilfried Lerch, Dornstadt-Tomerdingen (DE); Zsolt Nenyel, Blaustein (DE); Thomas Theiler, Ulm (DE)

(73) Assignee: HQ-Dielectrics GmbH, Dornstadt (DE)

( * ) Notice: Subject to any disclaimer, the term of this patent is extended or adjusted under 35 U.S.C. 154(b) by 265 days.

(21) Appl. No.: 13/057,841

(22) PCT Filed: Aug. 4, 2009

(86) PCT No.: PCT/EP2009/005644
§ 371 (c)(1),
(2), (4) Date: May 24, 2011

(87) PCT Pub. No.: WO2010/015385
PCT Pub. Date: Feb. 11, 2010

(65) Prior Publication Data
US 2011/0217849 A1 Sep. 8, 2011

(30) Foreign Application Priority Data
Aug. 7, 2008 (DE) .......... 10 2008 036 766

(51) Int. Cl.
*H01L 21/31* (2006.01)
(52) U.S. Cl.
USPC .......... 438/788; 438/798; 156/345.41
(58) Field of Classification Search
USPC .......... 156/345.41, 345.43; 438/788, 798
See application file for complete search history.

(56) References Cited
U.S. PATENT DOCUMENTS

| 6,194,835 | B1* | 2/2001 | Liehr | .......... 156/345.43 |
|---|---|---|---|---|
| 7,214,628 | B2 | 5/2007 | Chua | |
| 2007/0221294 | A1 | 9/2007 | Sasaki | |
| 2007/0227451 | A1 | 10/2007 | Gschwandtner | |
| 2010/0301012 | A1 | 12/2010 | Spitzl | |

FOREIGN PATENT DOCUMENTS

| DE | 4136297 | 5/1993 |
|---|---|---|
| DE | 19628952 | 1/1998 |
| DE | 19628954 | 1/1998 |
| DE | 19722272 | 12/1998 |
| DE | 19825125 | 12/1999 |

(Continued)

*Primary Examiner* — Zandra Smith
*Assistant Examiner* — Toniae Thomas
(74) *Attorney, Agent, or Firm* — Tarolli, Sundheim, Covell & Tummino LLP

(57) ABSTRACT

A device for producing a microwave plasma, and a device and a method for treating semiconductor substrates with a microwave plasma, the microwave plasma device comprising at least one electrode (21, 22, 23), an electrode (21, 22, 23) comprising a coaxial inner conductor (21) made of electrically conductive material and a coaxial outer conductor (22) made of electrically conductive material and surrounding the inner conductor at least partially and being disposed at a distance thereto, and a plasma ignition device (23) that is connected to the coaxial inner conductor (21), characterized in that the coaxial outer conductor (22) comprises at least one first partial region (31) in which it completely surrounds the coaxial inner conductor (21) along the longitudinal axis thereof and comprises at least one further partial region (32) in which it surrounds the coaxial inner conductor (21) partially such that microwave radiation generated by the microwave generator (20) can exit in the at least one further partial region (32) substantially perpendicular to the longitudinal axis of the coaxial inner conductor (21).

14 Claims, 11 Drawing Sheets

(56) References Cited

FOREIGN PATENT DOCUMENTS

| | | |
|---|---|---|
| DE | 102004039468 | 3/2006 |
| DE | 102006048814 | 4/2008 |
| EP | 0410706 | 1/1991 |
| EP | 1018150 | 11/2007 |
| WO | 2007028813 | 3/2007 |

* cited by examiner

DEVICE AND METHOD FOR PRODUCING DIELECTRIC LAYERS IN MICROWAVE PLASMA

RELATED APPLICATION

This application corresponds to PCT/EP2009/005644, filed Aug. 4, 2009, which claims the benefit of German Application No. 10 2008 036 766.4, filed Aug. 7, 2008, the subject matter, of which is incorporated herein by reference in its entirety.

FIELD OF THE INVENTION

The invention is related to a device for producing a microwave plasma as well as a device and a method for treating a semiconductor substrate by means of a microwave plasma. According to the inventive device and the inventive method, a dielectric layer without defects shall be produced on semiconductor process disks, especially at room temperature or a slightly elevated temperature.

BACKGROUND OF THE INVENTION

For production of electronic elements, such as memory chips, microprocessors, application specific integrated circuits or logic components, very precise and reliable working semiconductor production devices are required. The product to be manufactured, in many cases a semiconductor component, that is required to operate reliably and shall comprise reproducible electrical and physical properties. Several hundred single process steps need to be carried out for manufacturing such a semiconductor component. At the same time, the trend towards smaller and smaller structures, in other words, the ever increasing amount of semiconductor components per square centimeter always provides new challenges to manufacturers of semiconductor manufacturing devices. The production of error free or flawless isolation layers at low temperatures is an urgent problem in order to be able to produce semiconductor components comprising semiconductor structures of 45 nm, 32 nm, and even smaller, which are as reliable as logic components having a logical semiconductor structure of 65 nm. In the car industry, it is, e.g., requested that the electronic components used in that area are able to function over a long period without errors since human lives may depend from the reliable operation thereof. In order to fulfil such requirement, the reliability of the components needs to be improved accordingly, wherein inter alia a substantial approach exists in producing flawless dielectric layers or in producing layers that may be changed to a flawless condition via a corresponding post treatment.

Another requirement for the present semiconductor technology consists of lowering the thermal budget or heat input during production of, e.g., thermal oxide layers or other dielectric layers, as mentioned above.

Furthermore, new requirements in the development of transistors need to be fulfilled e.g. with respect to so called "metal-gates". Selective oxidation of silicon to the materials tungsten, tungsten silicide, tantalum nitride, titanium nitride, etc., should be carried out at low temperatures.

A still further request is a uniform oxidation of semiconductor structures consisting of differently doped silicon and the oxidation of silicon nitride. Furthermore, the production of reliably operating semiconductor component requires a production of flawless layers having high dielectric constants on tantalum, niobium, tantalum nitride, niobium nitride, and similar materials, e.g., as well as the post-treatment of flawed layers that were deposited via CVD and ALD processes, respectively.

In the past, dielectric layers were produced via thermal oxidation in ovens or in RTP reactors and via CVD processes or recently, via ALD processes wherein these processes generally do not produce flawless layers with respect to the electrical properties thereof, owing to the respective production method. Thus, contamination or flaws in the crystal structure may lead to electrically flawed layers during thermal oxidation. Problems with nucleation, as well as inclusion of particles, are the cause of electrically weak points of CVD and ALD layers, especially of thin layers, as well as inclusions of particles.

A further drawback of thermal oxidation is the so called thermal budget, i.e., the product of the process temperature multiplied with the process time. In many processes of semiconductor production, such as thermal oxidation and nitration, the thermal budget for the required layer building is so high that significant defects or other undesirable changes of the semiconductor element may be caused during the layer build up. For example, the diffusion profiles of the doping agents may be disturbed when the temperature budget gets too high, which decreases the reliability of the components or impacts performance.

Another drawback of thermal oxidation exists in differently doped and differently crystalline oriented silicon being oxidized with different velocities, which may lead, e.g., to different breakthrough voltages of the oxide depending on the orientation of the crystal. This poses a substantial problem in semiconductor production.

Another drawback of the thermal oxidation exists in the fact that silicon nitride oxidizes only minimally during oxidation of silicon. With currently used semiconductor components, structures are present in which a silicon nitride is located directly adjacent the silicon surface. With such structures, thermal oxidation processes may be used only limitedly or may not be used at all. With such oxidation processes, either no oxide layer or no desired oxide layer is formed in the transition area between the silicon surface and the silicon nitride layer.

Methods are known which try to avoid such drawbacks. EP 1,018,150 describes a method for forming an oxide, wherein a substrate is heated to a temperature which is sufficiently high to initiate a reaction between an oxide containing a gas and a hydrogen gas near the substrate in a process chamber. In this known method, hydrogen and oxygen are directed out a heated silicon disc which is at a raised temperature of higher than approximately 850° Celsius at a pressure of approximately $1/100$ atmospheric pressure, and a thin oxide layer of silicon and silicon nitride is formed. This kind of oxidation, in the literature also known under the name of In-situ wet oxidation, only produces thin oxide layers and furthermore, needs high temperatures which are unacceptable in many cases.

A selective oxidation of silicon to metals at room temperature or at a temperature of a few hundred degrees Celsius is not possible with such a method.

Layers having a high dielectric constant, especially crystalline layers, cannot be deposited flawlessly on large areas.

At the moment, there are devices in which it is tried to implement an oxidation of silicon on the base of RF excitation of a plasma. U.S. Pat. No. 7,214,628, e.g. discloses a method for gate oxidation wherein a device is used, in which an inductively formed plasma is generated via pulsed microwave radiation. In this method, the plasma is purposely held at a sufficiently large distance to the substrate in order to avoid ion generated defects when forming an oxide layer. The plasma is switched on and off. During the off interval, ions from the plasma may reach the substrate. During formation of the oxide layer, chamber pressure and pulse cycle are limited such that the defects induced via ion bombarding in the oxide layer are kept as small as possible. However, the plasma used in this facility does not achieve the density of the low energy ions and electrons, which are required in order to obtain the desired effects, i.e., in order to form a layer having a substantial thickness on the substrate within short time.

The US 2007/0221294 A1 also describes a plasma generating device on a microwave basis for forming an oxide or nitride film. In this device, a microwave plasma is directed through a distributor plate, which is spaced from a substrate to be processed, onto said substrate in order to form homogeneous oxide and nitride layers, respectively. Also, this microwave plasma does not comprise the necessary plasma density for achieving the desired effects due to the way of feeding into the process chamber.

SUMMARY OF THE INVENTION

Thus, it is an object of the invention to provide a device that generates a microwave plasma having a very high density of low energetic ions and electrons, such that the substrate to be provided with a dielectric layer, e.g., an oxide layer, obtains a strong negative charge on its surface. In this way, it is possible to form a sufficiently thick dielectric layer, e.g., oxide layers, on the substrate, preferably a semiconductor substrate, within a short time and at low temperatures below 800° Celsius. A further object of the invention is to provide a method for producing flawless and as homogenous as possible, dielectric layers in a microwave plasma preferably at low temperature.

This problem is solved by the invention via a device and a method of one or more of the attached claims. Advantageous embodiments are disclosed in the respective dependent claims. The inventive microwave plasma device comprises at least one electrode which may be connected to at least one microwave generator, wherein the at least one electrode comprises a coaxial inner conductor made of electrically conductive material and a coaxial outer conductor made of electrically conductive material and surrounding the inner conductor at least partially and being spaced thereto. The at least one electrode may advantageously comprise a plasma ignition device which is connected to the coaxial inner conductor, preferably the end thereof. The coaxial outer conductor comprises at least one first region in which the coaxial outer conductor completely surrounds the coaxial inner conductor along the longitudinal axis thereof and at least one further region in which the coaxial outer conductor partially surrounds the coaxial inner conductor such that microwave radiation generated by the microwave generator can exit in the at least one further region perpendicular to the longitudinal axis of the coaxial inner conductor. The coaxial inner conductor may be formed, e.g., in the form of a tube. In this further region, the coaxial outer conductor is open along the coaxial inner conductor, i.e., the coaxial inner conductor is not completely surrounded by the coaxial outer conductor in this region. Advantageously, each electrode is electrically connected to a microwave generator. An additional region may be directly adjacent to the further region. The additional region is characterized in that the coaxial inner conductor in this additional region is not surrounded by the coaxial outer conductor. This additional region may also be directly adjacent to the at least one first region and may also replace the at least one further region. One advantage of this embodiment is that a device for treating semiconductor substrates, in which the inventive microwave plasma device is used, may easily be scaled to a substrate diameter of 450 mm or more.

The at least one electrode is advantageously surrounded by a nonconductive material at least along the region, in which the coaxial outer conductor is open along the longitudinal axis of the inner conductor. This nonconductive material may be quartz, glass, alumina, or sapphire but is not limited to these materials. Advantageously, it is formed as a hollow cylinder. The hollow cylinder may house the electrode or at least the partial region of the electrode in which the outer conductor is open along the longitudinal axis of the coaxial inner conductor. Preferably, the nonconductive material also encloses the free end of the electrode which is not connected to the microwave generator. The microwave radiation power of the at least one electrode may advantageously be controllable in an open loop/closed loop manner.

A space may be formed between the nonconductive material, which encloses a part of the electrode, and the electrode itself, air at atmospheric pressure is present in said space. Alternatively, another gas, at reduced pressure may be present in this space. The space may contain, e.g., a process gas such as oxygen, hydrogen, nitrogen, $N_2O$, and/or an inert gas or a mixture of these gases. The pressure in this space may be between 0 bar and several bar. The space may also be filled with a liquid or solid dielectric material. The pressure in this space is to be selected such that no plasma is formed between the electrode and the isolator tube surrounding the electrode.

The coaxial outer conductor may be formed in the at least one further region in such a way that the coaxial outer conductor completely surrounds the coaxial inner conductor at one end of this region and such that the coaxial outer conductor opens and continuously tapers from one end of this region to the other end thereof. The coaxial outer conductor is advantageously designed in such a way that it opens beyond the edge region of the semiconductor substrate and the cross sectional area thereof is continuously tapered towards the opposing edge of the semiconductor substrate. The coaxial outer conductor may also comprise several openings along the longitudinal axis of the coaxial inner conductor in the at least one further region. The coaxial outer conductor may be cut open in elliptical or rhombic manner. The coaxial outer conductor may surround the inner conductor, e.g., in cylindrical manner, and the coaxial outer conductor may comprise a plurality of open sections along this surrounding cover the sections being cut open in e.g., elliptical, rhombic, or square form. The cover of the outer conductor may also be cut open at an angle such that it comprises an open region along the longitudinal axis of the inner conductor. The cover may be cut in a V-shape or it may be comprised of one or more cut-outs in V-form, in rectangular form, or in U-form. The cover may also be cut open in such a way that it spirals along the at least one further region around the inner conductor.

The ignition device may be formed as an inductor at the end of the inner coaxial conductor. To this end, the inner coaxial conductor may comprise a curved form, e.g., at its end. The ignition device is preferably formed as a linear Hertz oscillator, wherein the wavelength of this linear Hertz oscillator corresponds to half the wavelength of the microwave generator and/or an integer multiple thereof. The microwave generator advantageously comprises a microwave frequency of 2.45 GHz or 5.4 GHz or 915 MHz or 13-14 GHz. The microwave generator may also comprise any other frequency.

The microwave plasma device may be a part of a facility for plasma treating of semiconductor substrates, e.g. in the semiconductor processing industry. The microwave plasma device may comprise e.g., a processing chamber enclosed by a metal box, wherein the metal box comprises a closable opening for introducing the semiconductor substrate, wherein means for cooling and/or heating of the metal box may be provided. It may comprise a substrate holder for holding the semiconductor substrate which is located in the process chamber and preferably comprises at least one isolator tube disposed in the process chamber, which is advantageously vacuum sealed against the process chamber, and wherein at least the part of the at least one electrode is inserted therein which comprises the open coaxial outer conductor. Furthermore, the metal box comprises at least one opening, but preferably, a plurality of openings for introducing a process gas as well as at least one opening, but preferably several further openings for exhausting the process gas. The openings for exhausting the process gas are preferably permanently fixed to a vacuum pump. The pressure of the process gas in the process chamber is preferably adjustable to a range between 1 mTorr and 20 Torr in a closed loop end and/or open loop manner. The metal box may consist of e.g., aluminum.

Preferably, the substrate holder is rotatably arranged in the process chamber. The substrate holder is rotatable around at least one axis, the axis being advantageously arranged perpendicular to the semiconductor substrate surface of a semiconductor substrate disposed in the substrate holding region of the substrate holder. The distance between the substrate holder and the at least one isolator tube may be variable such that a desired distance may be set between the substrate and the microwave energy radiating electrodes during processing. The substrate holder may be coolable and/or heatable. The substrate holder may consist, at least partially, of aluminium nitride, and/or silicon nitride, and/or quartz, and/or sapphire, and/or silicon carbide. With round substrates, e.g., a semiconductor wafer, the substrate holding region may be surrounded by an additional annular region which comprises a so-called extended substrate region annularly arranged around the substrate holding region which may comprise elements of substrate material annularly arranged around the substrate. The substrate holding region may comprise a susceptor for holding the semiconductor substrate wherein the susceptor may be connected to at least one thermal couple for measuring the temperature of the substrate.

Furthermore, at least one temperature measuring device for measuring the temperature of a semiconductor substrate held in the substrate holding region of the substrate holder may be provided. Such a temperature measurement may be effected, e.g., pyrometrically.

The process chamber comprises at least one electrode, but preferably one or more isolator tubes generally arranged parallel to each other in a plane above the substrate holding region and/or in a plane below the substrate holding region, wherein each isolator tube may preferably enclose one electrode or at least the one further region of the respective at least one electrode which comprises the region of the coaxial conductor provided for the exit of the microwave radiation, i.e., at least the region in which the outer coaxial conductor along the longitudinal axis of the coaxial inner conductor is open. The inner coaxial conductor may additionally comprise at least one additional region which may also be provided instead of the at least one further region. The additional region is provided at the end region of the inner coaxial conductors, radiates microwaves and is not surrounded by the outer coaxial conductor. In this case, the isolator tube also preferably encloses this additional region of the electrode.

The coaxial outer conductor of the at least one electrode is preferably open beyond the edge region of a semiconductor substrate arranged in the substrate holding region of the substrate holder and is most preferably open over the whole extended substrate region. In case the device comprises a plurality of electrodes, these electrodes or at least parts thereof, including the regions radiating electromagnetic energy, are preferably housed separately in isolator tubes. The isolator tubes are preferably generally arranged parallel to each other wherein "generally parallel" to each other may be understood in such a way in that the longitudinal axis of the isolator tubes are arranged at an angle of less than 10° to each other. The isolator tubes arranged above the substrate holding region are preferably all arranged in the same plane. In case several isolator tubes are arranged below the substrate holding region in the process chamber, these isolator tubes are also preferably arranged in one plane. The radiating regions of the electrodes housed in the isolator tubes most preferably cover the whole substrate holding region, preferably also that extended substrate region. As far as the device comprises a plurality of electrodes, the microwave radiation power of the electrodes may be controlled group wise in an open loop manner and/or a closed loop manner and/or separately for each electrode and/or for a predetermined number of electrodes. Preferably, adjacent electrodes are arranged such that they may be connected to a respective microwave source opposing sides of their respective isolator tube in order to increase the homogeneity of the plasma. The electrode may be connected separately or group wise to different microwave sources, wherein different microwave sources may radiate microwave energy with the same or preferably with different radiating frequencies.

Under and/or above the substrate holding region, additional heating elements may be arranged in the process chamber. These heating elements may be, e.g., halogen lamps and/or arc lamps. The heating elements may be separated from the process chamber by quartz glass and/or quartz glass doped with impurity atoms and/or quartz glass which comprise a region doped with impurity atoms.

On the upper side of the metal box, an isolator plate may be arranged such that a contact of the plasma and the metal wall is inhibited. The metal box may comprise surface regions from anodized aluminum, e.g., on its side facing the process chamber. Further, the process chamber may comprise an electrode spaced from the metal box above and/or below the substrate holding region wherein the spaced electrode is preferably fixedly connected to the isolator plate. This spaced electrode may be connected, e.g., a direct current or pulsed direct current in order to carry out an anodized oxidation. The electrode may also be connected to alternating current. Alternating current is adapted to modulate the plasma and/or the surface charge of the substrate to be processed, e.g., of a semiconductor wafer and may contribute to such improvement of the processed results. In this context, it is also possible to connect the electrode only temporarily, e.g., in a pulsed manner, to a direct current while the plasma process takes place. It is also possible to carry out the plasma process itself in a pulsed manner and/or modulated manner over time. The person skilled in the art will consider variations and combinations of these possibilities in order to obtain desired process results.

The processing of a semiconductor substrate in such a device may comprise the following steps:

a) Introducing the semiconductor substrate into the process chamber and disposing the semiconductor substrate on the substrate holder arranged in the process chamber;

b) Evacuating the process chamber;

c) Introducing process gas into the process chamber;

d) Inserting microwave radiation via the electrode/electrodes of the microwave plasma device into the process chamber and generating a microwave plasma in the process chamber;

e) Switching off the microwave radiation;
f) Venting the process chamber;
g) Removing the semiconductor substrate from the process chamber.

Between the steps a) to g), the semiconductor substrate may be heated to a predetermined temperature before and/or during and/or after the step d) of the process. The predetermined temperature is preferably between room temperature and 650° Celsius.

The process gas may be, e.g., argon, helium, oxygen, hydrogen, nitrogen, $H_2O$ (Steam), deuterium, $D_2O$ (heavy water in form of steam), and/or nitrous oxide or a mixture of these gases. The gas may also comprise e.g. $NF_3$, $CF_4$, or $Cl_2$ or a mixture of these gases. This may be advantageous during a cleaning operation.

With the inventive device, flawless dielectric layers may be produced. In this context, the negative charging of the substrate surface is the prominent force for producing a flawless dielectric layer since build-up of the layer is continued in all regions of the surface as long as a layer thickness equivalent to the charge is obtained.

An advantage of the inventive method of oxidation is that, contrary to the thermal oxidation, which is controlled by diffusion due to the required temperature, a method for oxidizing is used, which results in a build-up of an oxide layer due to the electric field that is generated by the surface charge. In CVD and ALD methods, the respective chemical potentials of the substrate surfaces are required for a build-up of a flawless layer, which are difficult to control.

Since the oxidation is caused by the electric field of the negative charging caused by the microwave plasma, the oxidation may now be carried out at room temperature or at only slightly increased temperature. The oxidation is independent from the substrate temperature, and the substrate temperature may now be set in such a way that optimal process results are obtained. Further, the oxidation is independent from the species and the concentration of the doping agents in the silicon. With the inventive method, it is also possible to oxidize silicon nitride well at room temperature. The addition of hydrogen does not have a substantial influence on the oxide layer thickness and the build-up of the oxide layer up to a high percentage of hydrogen in the process gas, which allows a selective oxidation of silicon versus metals and metal nitrides.

Besides, oxidation of silicon, also oxidation of tantalum, niobium, aluminum, and nitrides thereof are possible. By oxidation of the metals or their nitrides, respectively, flawless high quality dielectric layers may be deposited at room temperature, contrary to CVD and ALD methods, which layers may be used, e.g., for MIM capacitors used for "RF" and "decoupling" applications as well as for a plurality of automotive communication and other logic technologies.

The inventive device and the inventive method allow production of a microwave plasma having a very high density of low energy ions and electrons wherein the degree of ionization of the excited gases increases in the square of the excitation frequency. An ionization degree of approximately 80% may be obtained with a microwave plasma having an excitation frequency of, e.g., 2.45 GHz if the incident power is sufficient for saturation of the plasma. Due to the difference between the electron masses and the positively charged ions which amounts to 4 decimal powers and also the low collision cross section of the low energy electrons, the mean free path of the electrons in the plasma is around 2 decimal powers higher than the mean free path of the ions. Thus, the electrons reach the surface of the substrate much faster in the border zone between plasma and substrate, and a high negative charge on the substrate is formed. The charging process only stops if sufficient positive ions are attracted from the plasma. A portion of the positive ion, in the present case, e.g. primarily a portion of the single positively charged oxygen ions, i.e., the single positively charged oxygen produced by the plasma is neutralized and returns to the plasma space. Another portion of the single positively charged oxygen ions attracts two or three electrons, respectively, and becomes single or two-fold negatively charged. This portion is rejected from the substrate by the negative surface charge of the substrate. A portion of the negatively charged oxygen is also transferred back to the plasma space. Another portion of the negatively charged oxygen may contribute to the oxidation of the substrate and to the build-up of the dielectric if is passes through the zone of negative charge of the plasma.

The inventive device and the inventive method will be more closely explained in the following by means of preferred embodiments referring to the figures. In the figures, elements having the same effect in different figures are referenced by the same reference signs. The person skilled in the art will recognize embodiments and variations of the examples as well as combination of the disclosed embodiments which are within the scope of the invention. The inventive device may advantageously be used in other applications or other methods which are not described here.

DETAILED DESCRIPTION

Figure 1:
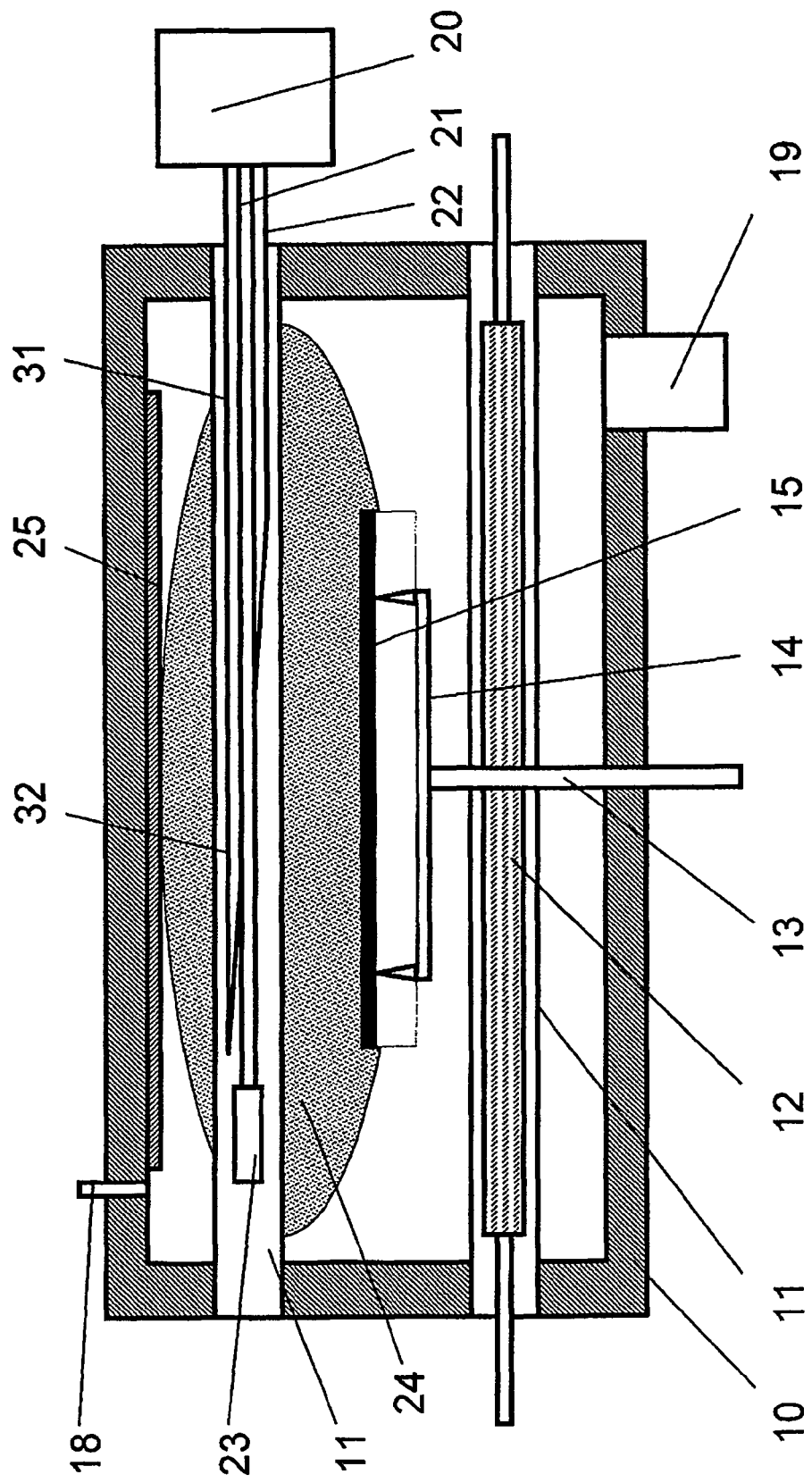
FIGS. 1, 1a, 1b, 2, 3 show different embodiments of the inventive device.
Figure 1A:
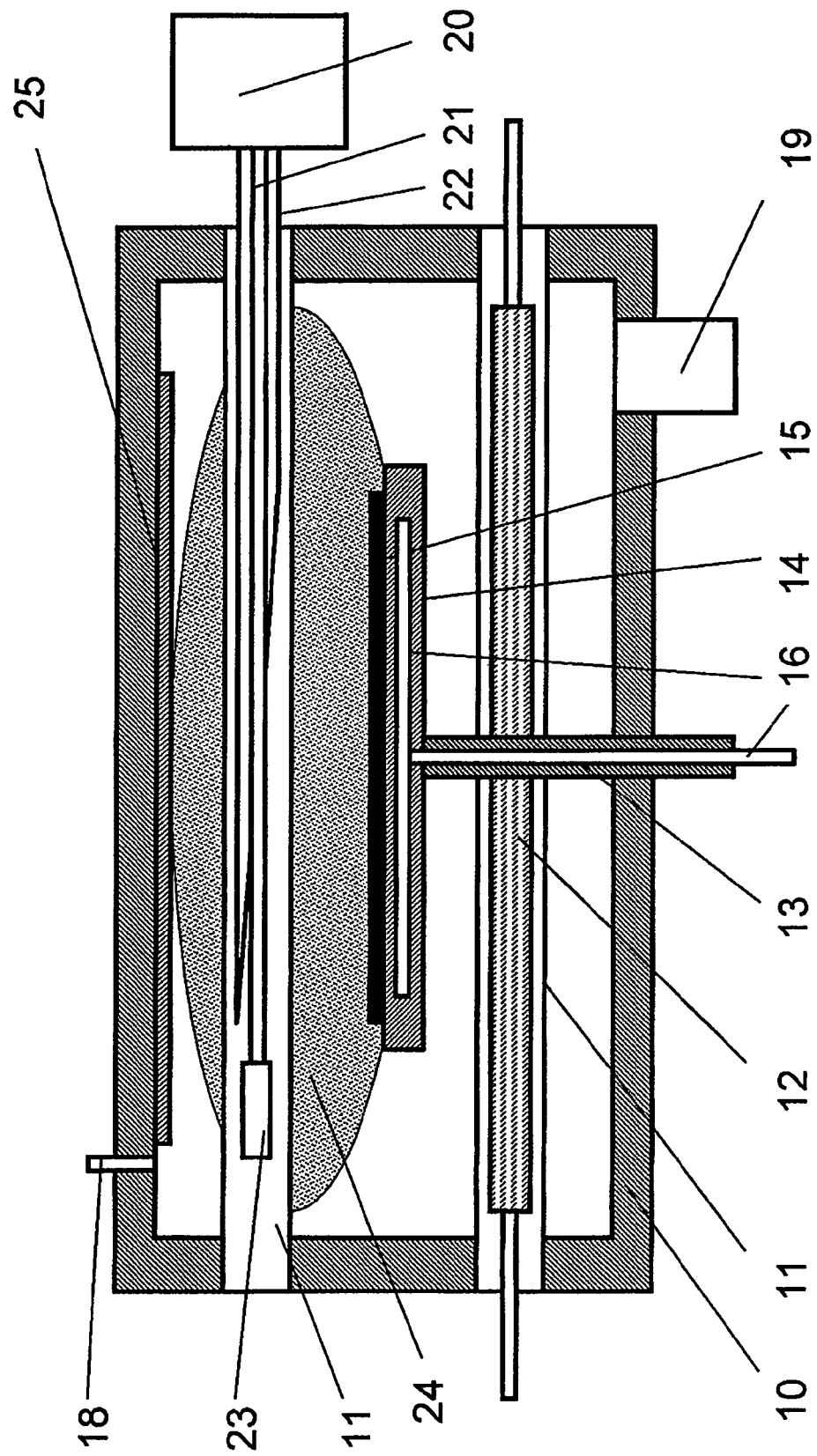
Figure 1B:
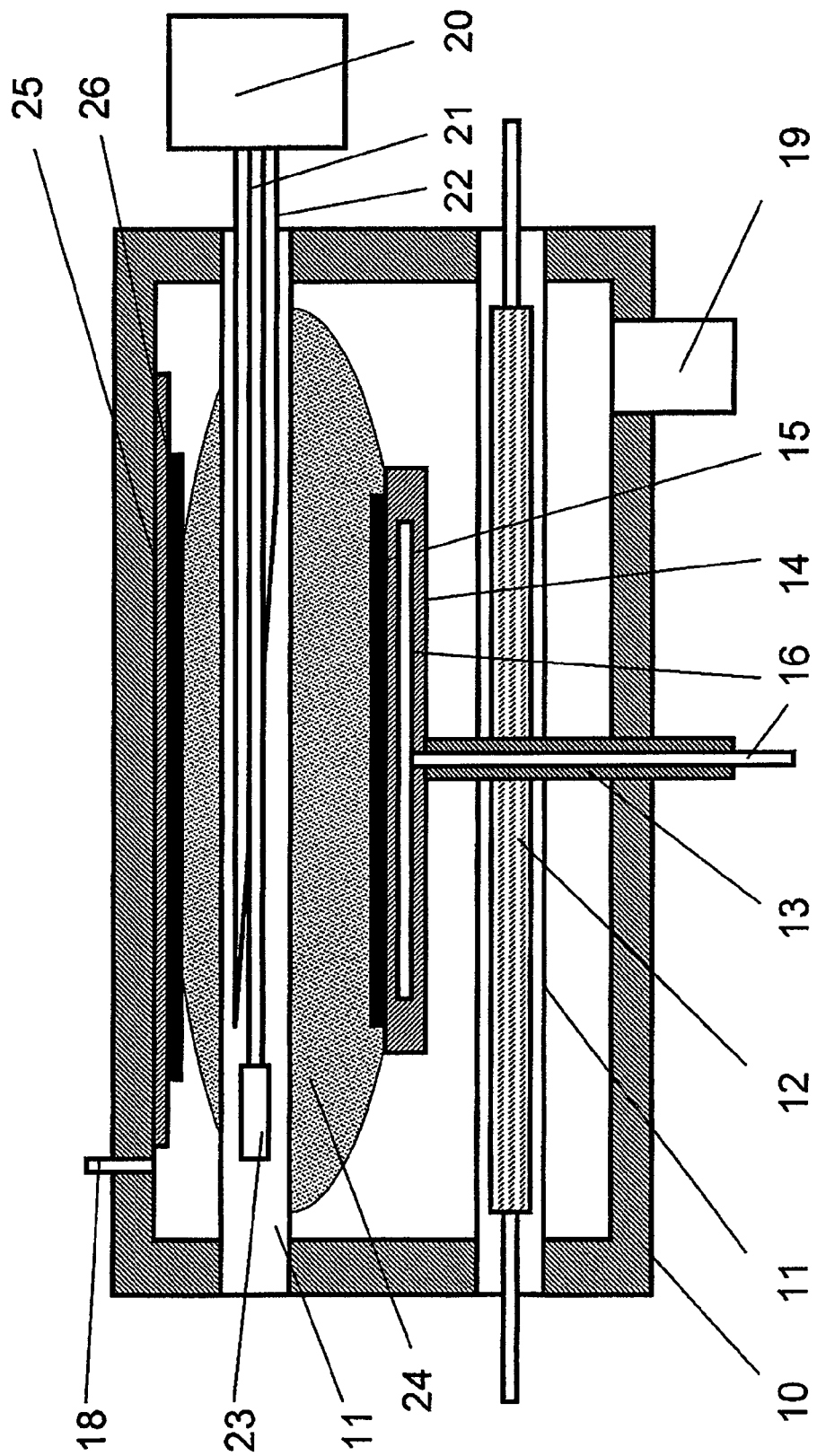

FIGS. 1, 1a, and 1b show a cross section of the inventive device. These figures show a metal box 10, which comprises an opening (not shown) which may be closed by a door (not shown) and which encloses a process chamber. The metal box 10 is connected to isolator tubes 11. The isolator tubes 11 are preferably connected to the metal box 10 on opposing sides of the metal box 10 via seals which preferably hermetically seal the inner space of the process chamber against the surrounding atmosphere, and the isolator tubes 11 span the entire process chamber. The isolator tubes 11 preferably consist of quartz or alumina. These seals are preferably manufactured in a way that, if the process chamber is evacuated, no surrounding atmosphere may enter through these seals into the process chamber. One part of the isolator tubes 11 may hold, e.g., heating elements 12 such as halogen lamps or arc lamps. As can be seen in FIG. 1, a substrate holder 14 may be provided in the process chamber. The substrate holder 14 is preferably rotatable around a drive axis 13 of a drive and is axially shiftable there along. The substrate holder 14 is provided for holding the substrate 15 on, e.g., pins in a substrate holding region in the process chamber. The substrate holder 14 located in the process chamber may comprise cooling and/or heating fluid passages 16 as can be seen, e.g., in FIGS. 1a and 1b. In this case, the substrate 15 may be arranged flat on the substrate holder 14 in order to enable good thermal contact to the substrate holder. The heating elements 12 (halogen radiators, gas discharge lamps, etc) are for possibly heating the susceptors or substrate to a desired processing temperature are arranged below the substrate to be processed.

The metal box 10 comprises at least one but preferably several gas inlets for introducing process gas, as well as at least one gas outlet 19, which is preferably connected to a vacuum pump. The isolator tubes arranged above the substrate holding region hold the electrodes 21, 22, 23, which are connected to at least one microwave generator 20. The electrodes 21, 22, 23 comprise a thin tubular coaxial inner conductor 21 made from electrically conductive material as well as a coaxial outer conductor 22, which at least partially surrounds the inner conductor and is spaced therefrom. Furthermore, a plasma ignition device is connected to the coaxial inner conductor 21. The microwave plasma 24 is generated outside the isolator tube 11 in the process chamber. The isolator tubes 11 preferably consist of a quartz glass and in their inner space, they hold, e.g., air under normal pressure.

The upper part of the metal box 10 may, as shown in FIGS. 1, 1a, and 1b, preferably be provided with an insulating material 25 in order to prevent that the plasma 24 cause metal contaminations on the semiconductor substrate 15. FIG. 1b shows an embodiment in which an electrode 26 is firmly fixed to the insulating material 25. By means of this electrode 26, an additional potential may be applied between the semiconductor substrate and the electrode, and an anodic oxidation may be carried out. This has the advantage that thicker layers may be produced. The coaxial outer conductor 22 of the electrode 21, 22, 23 comprises at least one first region 31 in which the coaxial outer conductor completely encloses the coaxial inner conductor 21 along the longitudinal axis thereof. The coaxial outer conductor also comprises at least one further region 32 in which it partially encloses the coaxial inner conductor 21 such that microwave radiation generated by the microwave generator 20 may exit substantially perpendicular to the longitudinal axis of the coaxial inner conductor 21 in the at least one further and region 32, when the electrode 21, 22, 23 is connected to the microwave generator 20.

Figure 2:
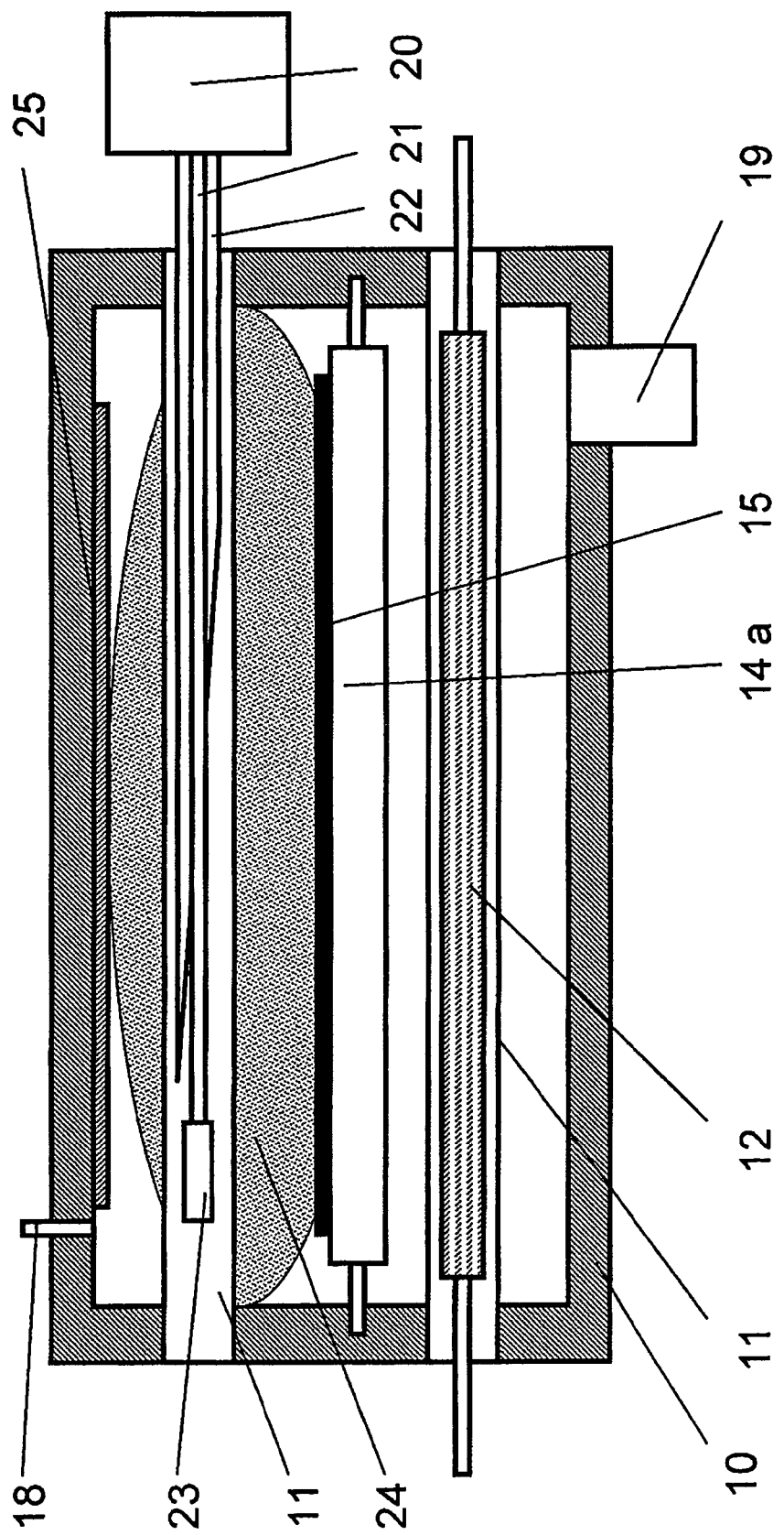

FIG. 2 shows another embodiment of the inventive device. Compared to the embodiments in FIGS. 1, 1a, and 1b, the susceptor 14 is replaced by a transport roller 14a which transports the semiconductor substrate 15 through the metal box.

Figure 3:
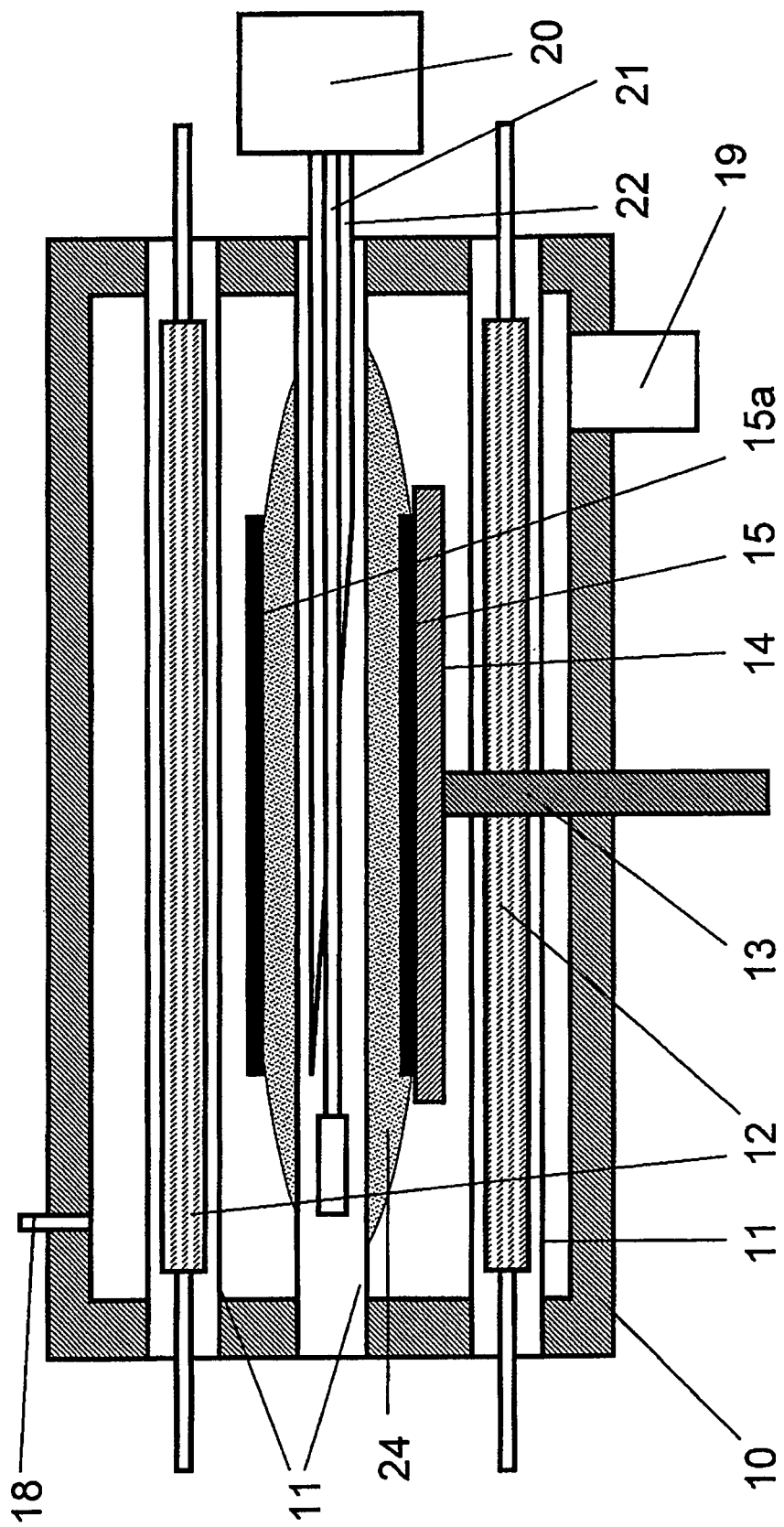
Figure 4:
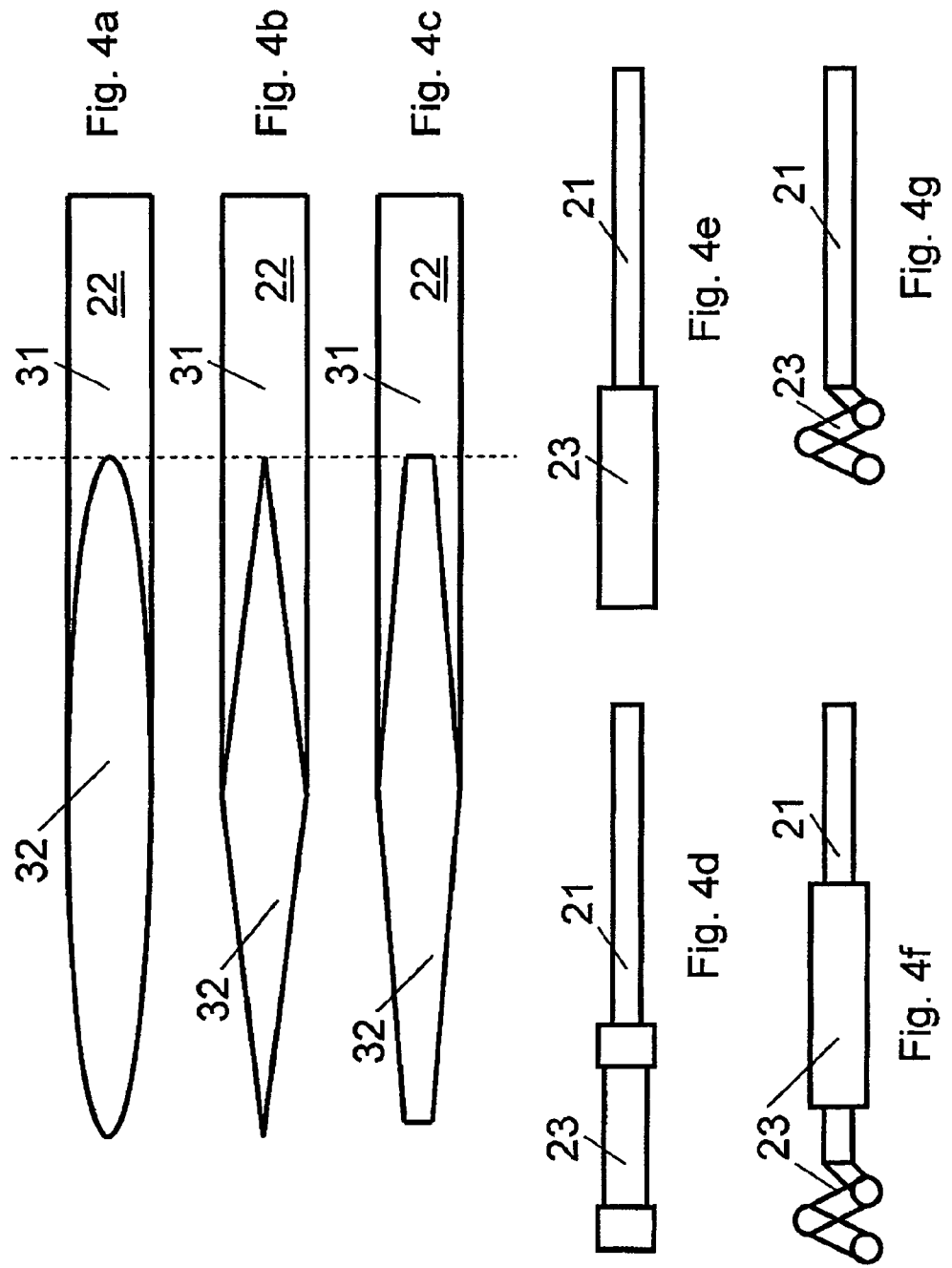
FIGS. 4a, 4b, 4c show different embodiments of 4a, 4b, 4c of the coaxial outer conductor
FIGS. 4d, 4e, 4f, 4g show different embodiments of the coaxial inner conductor of the electrode.

FIG. 3 shows a further embodiment of the inventive device. In this case, the electrodes 21, 22, for generating the microwave plasma, are located between one semiconductor substrate 15 and another semiconductor substrate 15a in the process chamber. The heating elements 12 are arranged both above and below the two semiconductor substrates. Several embodiments of the coaxial outer conductor are shown in FIGS. 4a, 4b, and 4c. The first regions 31 are illustrated in FIGS. 4a, 4b, and 4c, wherein the coaxial outer conductor 22 completely surrounds the coaxial inner conductor as well as the further regions 32, in which the coaxial outer conductor 22 partially surrounds the coaxial inner conductor. FIG. 4a shows an elliptically cut open coaxial outer conductor. FIG. 4b shows a coaxial outer conductor cut open in rhombic form and FIG. 4c shows a coaxial outer conductor cut open in hexagonal form. These embodiments of the coaxial outer conductor are advantageous since the electromagnetic wave, which is transported between the inner and outer conductor may exit through the opening 32 of the outer conductor 22 in order to generate the plasma cloud 24. By these means, the plasma cloud 24 is confined in an axial direction, and the plasma is prevented from spreading to the passages for the isolator tubes 11 in the metal box 10 (see e.g. FIG. 1) and causing metal contamination. Furthermore, this advantageous embodiment of the outer conductor 22 prevents that the electrical conductivity of the substrate and its spacing to the electrode may have influence on the form of the plasma cloud.

FIGS. 4d, 4e, 4f, and 4g show advantageous embodiments of the plasma ignition devices 23 which are preferably fixed to the end of the coaxial inner conductor 21. The ignition device 23 of the microwave plasma device facilitates reliable ignition operation at low pressures as well as at high pressures in the device and may be formed as a linear Hertz oscillator having half the wavelength of the microwave or an integer multiple thereof. Further, the ignition device 23 may be formed as an inductivity at the end of the inner conductor 20 wherein the inductivity is formed from several coils of the inner conductor.

The inventive device works as follows:

The microwave plasma is generated at a negative pressure of approximately $1/10,000$ to $1/1,000$ of the atmospheric pressure upon introduction of oxidizing neutral and/or reducing gases in the process chamber and excitation of the gases by microwave energy from a microwave generator 20, usually at a frequency of 2.54 GHz. The substrate 15 to be processed is rotated and held at a desired distance (of approximately 1 cm to 15 cm) with respect to the electrodes 21, 22 of the microwave coaxial conductor via the rotation and lift arrangement 13 and the substrate holder 14, 14a. By appropriately setting the pressure, the gas mixture, the microwave power and the electrode distance, a desired plasma density or charge density at the substrate may be produced whereby the desired processing results may be attained. To create a plasma independent from the conductivity of the substrate and the distance to the electrodes, it is necessary that the microwave energy introduced between the coaxial inner conductor 21 and the coaxial outer conductor 22 homogeneously exits via an opening of the coaxial outer conductor 22 and that the microwave energy is homogeneously introduced into the plasma zone, where it is absorbed. This is attained by appropriate design of the coaxial outer conductor 22 around and along the coaxial inner conductor 21 in combination with a corresponding ending thereof or a corresponding ignition device. A plasma excitation only via the inner conductor, which is usually used in rod or slab shaped plasma excitation cannot be used here since the microwave may propagate through the conductive substrate and may lead to uncontrollable effects. One end of the coaxial inner conductor 21 is formed by the plasma ignition device 23, which is provided to ensure that a gas may reliably ignite at low pressures as well as at high pressures.

Figure 5:
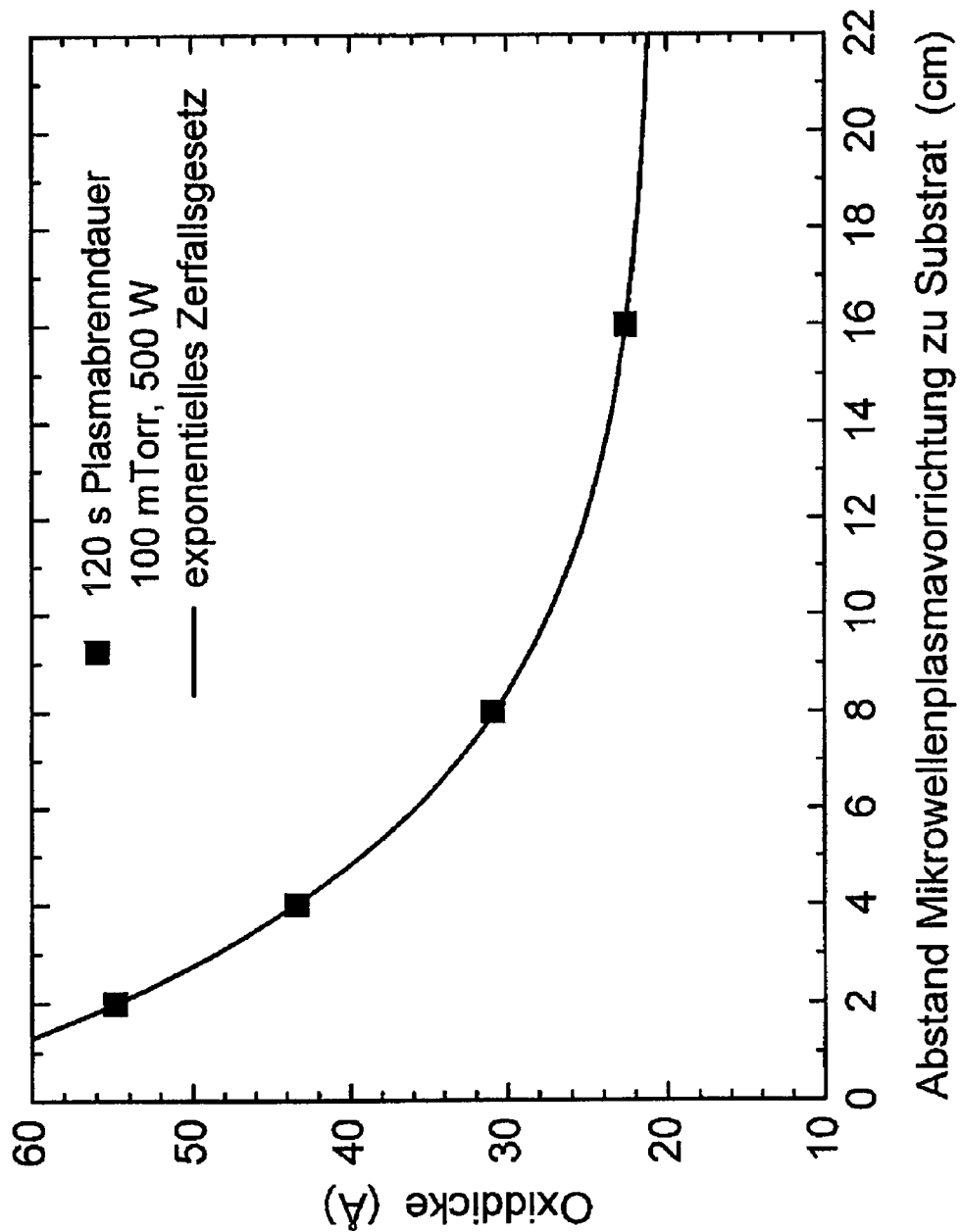
FIGS. 5, 6, 7, and 8 show oxidation results of different oxides formed on semiconductor substrate by means of the inventive device.

FIG. 5 shows the thickness of oxide grown on a silicon substrate over the distance between the substrate and the microwave plasma device, at a plasma burn time of 120 seconds, a process gas pressure of 100 mTorr, and a microwave radiation power of 500 watts; oxygen was used as a process gas. The grown thickness of oxygen follows an exponential law.

Figure 6:
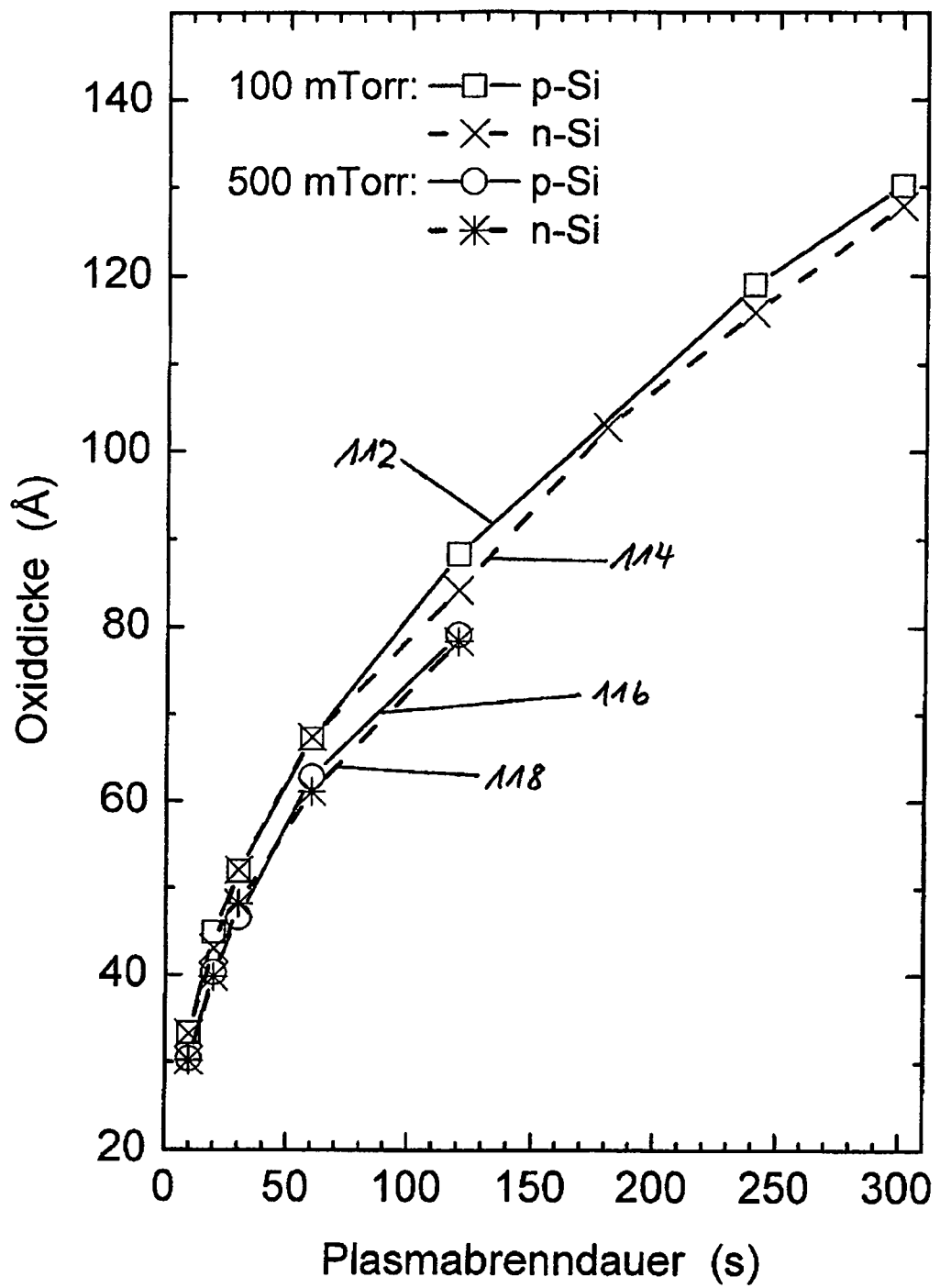

FIG. 6 shows the growth curve of the plasma oxide at room temperature for different substrates and different process gas pressures in the inventive device as a function of the burning time of the plasma in seconds. Curve 112 having square symbols shows the thickness of the oxide on p-silicon doped with boron at a processed gas of 100 mTorr oxygen in the process chamber. Curve 114 having cross symbols shows the thickness of the oxide on n-silicon doped with phosphorus at a process gas pressure of 100 mTorr. Curve 116 having round symbols shows the thickness of the oxide on p-silicon doped with boron at a processed gas pressure of 500 mTorr. Curve 118 having star shaped symbols shows the thickness of the oxygen on n-silicon doped with phosphorous at a process gas pressure of 500 mTorr. The Figure shows that the growth of silicon dioxide is independent from the underlying doping of the substrate. This example shows that a microwave plasma having a very high density of low energy ions and electrons is produced by the inventive method which results in the oxidation of a substrate of, e.g., silicon at temperatures between room temperatures and 700° Celsius, which is independent from the orientation, the doping and largely, the substrate itself.

Figure 7:
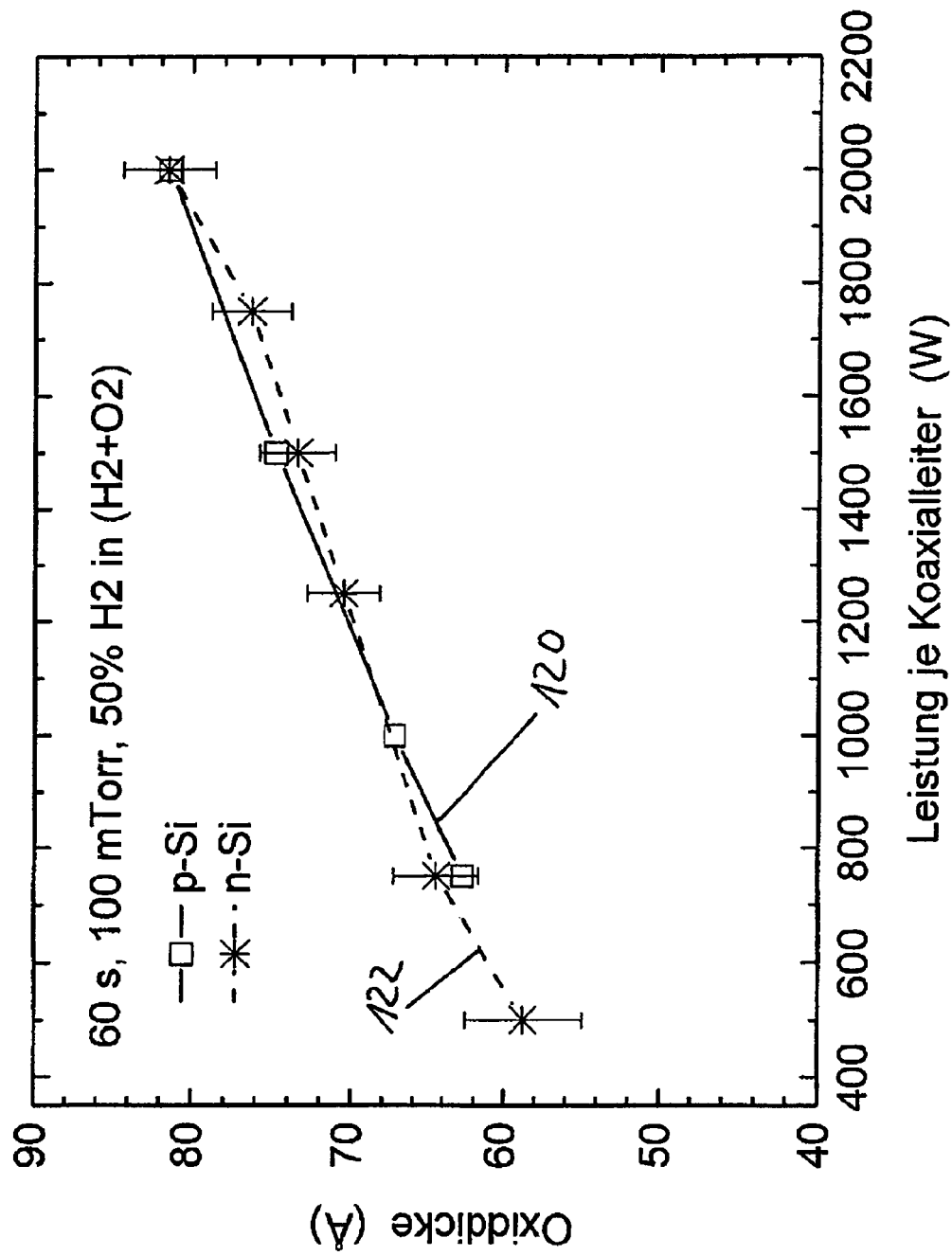

FIG. 7 shows the grown thickness of the oxide in angstrom in the inventive device depending on the plasma power per electrode in a plasma burn time of 60 seconds and a process gas pressure of 100 mTorr. A mixture of 50% hydrogen in hydrogen and oxygen was used as the process gas. Curve 120 having square symbol shows the thickness of the oxide on p-silicon doped with boron depending from the microwave power. Curve 122 having the star shaped symbols shows the thickness of the oxide on n-silicon doped with phosphorous as well as the possibly existing measurement deviation at each measurement. This Figure shows that the growth of oxygen is independent from the doping of the substrate and that the growth of the oxide steadily increases with an increase in the applied plasma power.

Figure 8:
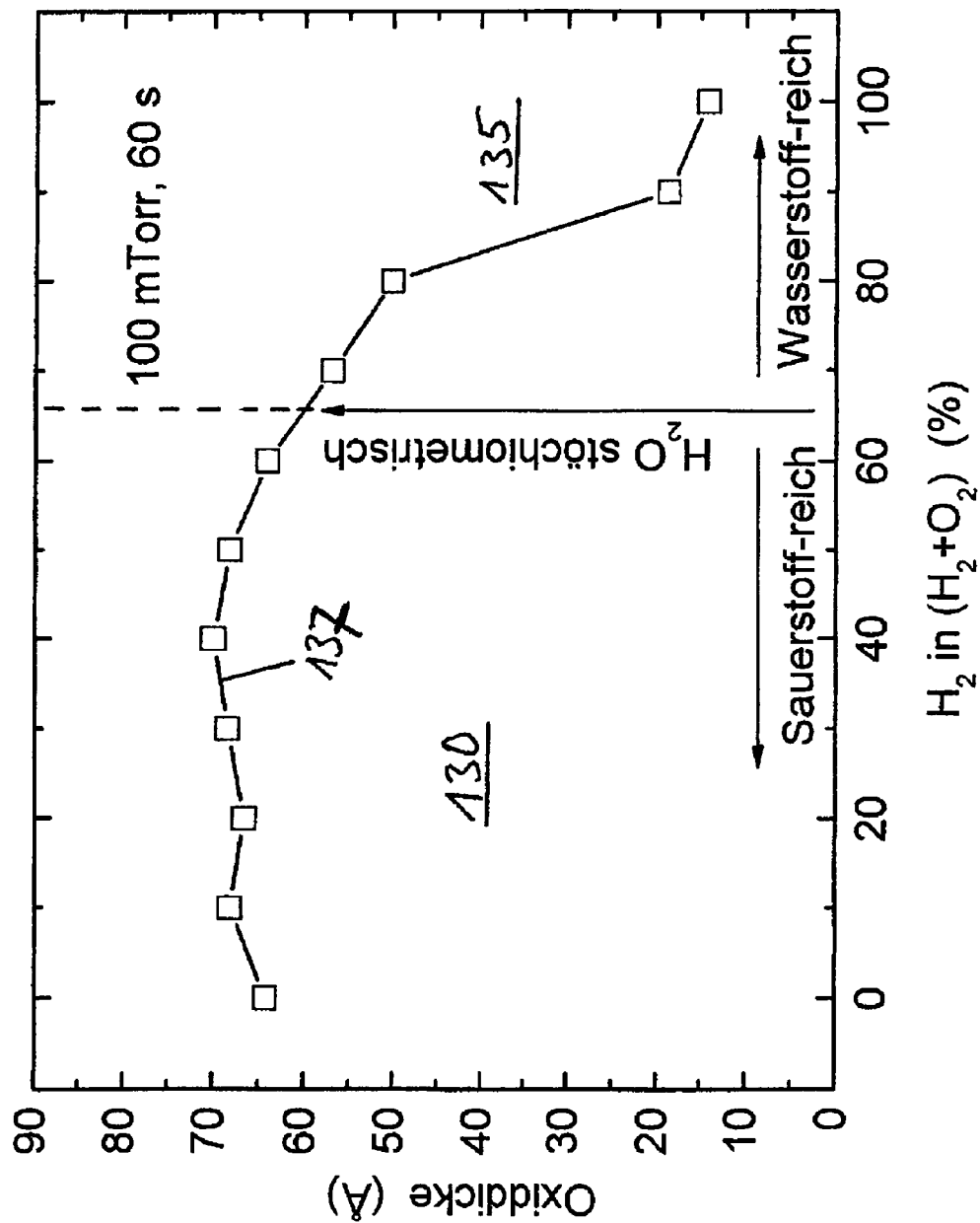

FIG. 8 shows the dependency of trie thickness of the oxide from the addition of hydrogen to oxygen A region in which the mixing ratio of hydrogen and oxygen is lower than 2:1 is defined as an oxygen rich region 130. A region in which the mixing ratio of hydrogen and oxygen is higher than 2:1 is defined as hvdrooen rich region 135 A mixing ratio of two parts hvdrooen and one part oxygen is referred to as a stoichiometric mixing ratio of hvdrooen and oxygen Curve 137 shows the thickness of the oxide in Angstrom which grows on a silicon disc or wafer during a plasma burn time of 60 seconds. The thickness of the oxide remains constant within the boundanes of a measurement error up to an addition of hydrogen in stoichiometric mixture ratios. The thickness of the oxide decreases, as expected if the hydrogen concentration is increased further. This example shows, the particular advantage of the inventive method with respect to selective and non-selective oxidation. By choosing the mixture ratio of oxyqen and hydrogen, any desired process conditions at room temperature may be set. Thus, evaporation of the metal during selective oxidation may be largely avoided. A selective oxidation of silicon in the presence or tungsten, niobium, tantalum, and tantalum nitride, titanium, titanium nitride or wtth nitrides is possible, and substantially the same oxidation rate for the oxidizing silicon may be reached as in a non-selective oxidation of silicon in the presence of tungsten, niobium, tantalum, tantalum nitride, titanium, titanium nitride or other nitride.

Figure 9:
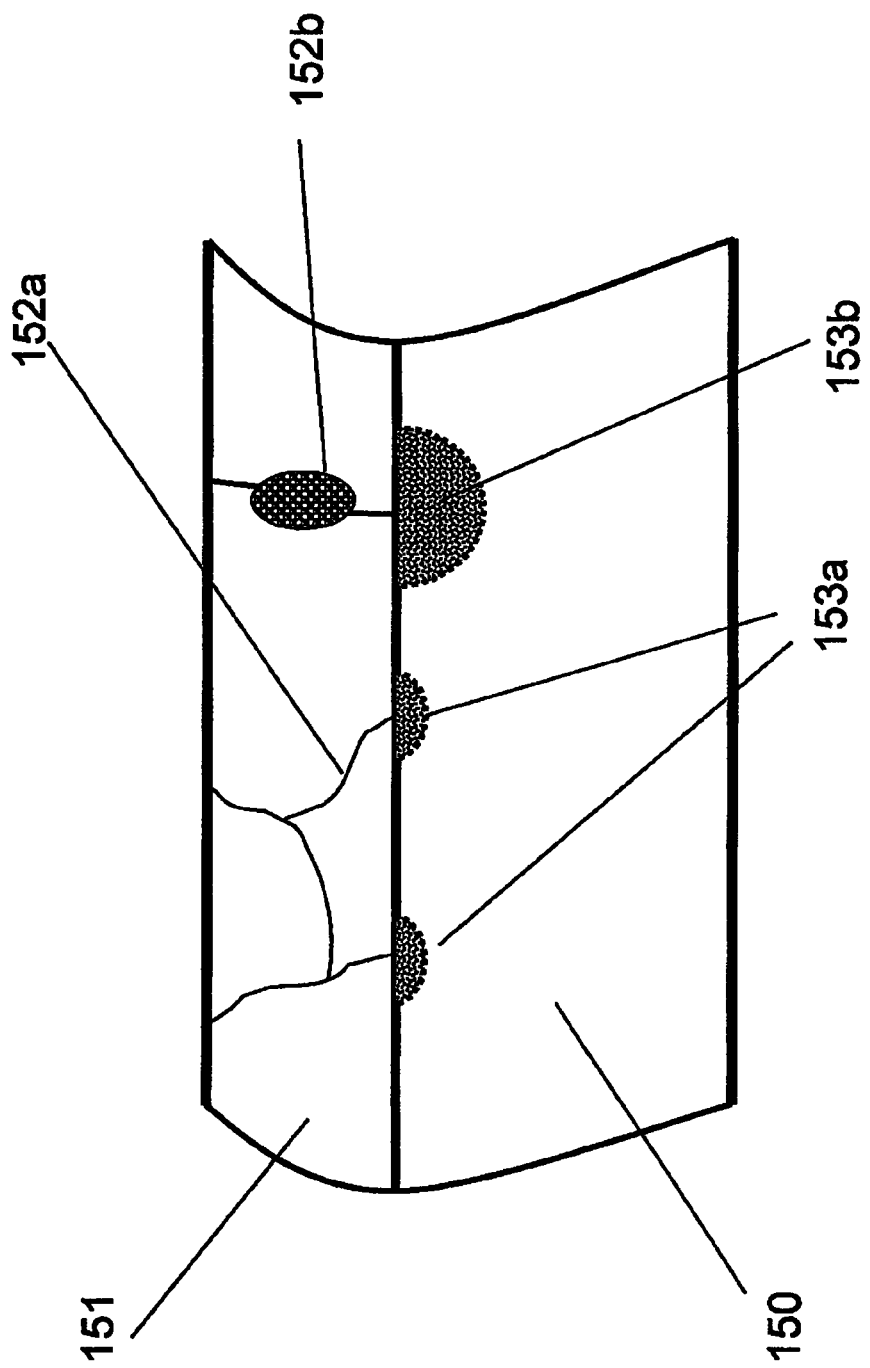
FIG. 9 shows an example of a flawed dielectric on a substrate which was repaired by means of anodic oxidation in a plasma.

FIG. 9 shows a substrate 150 made from silicon on which a defective dielectric 151 having defects 152a, 152b is located, which substrate was repaired via anodic oxidation in a plasma of $SiO_2$ and $Ta_2O_5$, see hemispheres 153a, 153b. Thus, breakdown voltages of up to 14V may be realized. In the anodic oxidation may be advantageously used with other substrates such as Ta, TaN. By applying a direct current to, e.g., electrode 26, the anodic oxidation may be carrie dout and thicker dielectric layers may be produced on the substrate in this way.

The invention claimed is:

1. A device, having a microwave plasma device, comprising at least one electrode (21, 22, 23) which is connectable to a microwave generator (20), wherein the at least one electrode (21, 22, 23) comprises a coaxial inner conductor (21) made from electrically conductive material as well as a coaxial outer conductor (22) made from electrically conductive material, which at least partially surrounds the coaxial inner conductor and is spaced therefrom;

wherein the coaxial outer conductor (22) comprises in its longitudinal direction at least one first region (31), in which the coaxial outer conductor completely surrounds the coaxial inner conductor, and at least one further region (32), in which the coaxial outer conductor is formed such that it tapers or narrows, in particular in a constant manner, from said first region (31), and thus surrounds the coaxial inner conductor (21) less and less, such that microwave radiation generated by the microwave generator (20) may exit from the at least one further region (32) substantially perpendicular to the longitudinal axis of the coaxial inner conductor (21), when the at least one electrode (21, 22, 23) is connected to the microwave generator (20); and wherein the at least one electrode comprises a connecting end for connecting the microwave generator and a free end, wherein the coaxial outer conductor tapers towards the free end.

2. The microwave plasma device of claim 1, further comprising a plasma ignition device (23) connected to the coaxial inner conductor (21), in particular the free end thereof.

3. The microwave plasma device of claim 2, wherein the ignition device (23) is formed as linear Hertz oscillator wherein the wavelength of the linear Hertz oscillator corresponds to half the wavelength of the microwave generator (23) and/or an integer multiple thereof, and/or wherein the coaxial inner conductor extends beyond the coaxial outer conductor in the longitudinal direction thereof, and/or wherein the coaxial inner conductor (21) has a curved shape at its end.

4. The microwave plasma device of claim 1, wherein the at least one further region (32) is surrounded by a nonconductive material (11) along the longitudinal axis of the coaxial inner conductor (21).

5. The microwave plasma device of claim 4, wherein the nonconductive material (11) is quartz glass, alumina, or sapphire, and/or wherein the nonconductive material (11) is formed as a hollow cylinder, and/or wherein the nonconductive material (11) surrounds one end of the electrode (21, 22, 23) wherein a space may be formed between the nonconductive material and the at least one further region (32), which may be filled with ambient air at ambient pressure.

6. The microwave plasma device of claim 1, wherein the coaxial outer conductor comprises an opening (22a, 22b, 22c) having elliptical or rhombic form in the at least one further region (32).

7. A device as set forth in claim 1, the device being adapted for semiconductor processing, the device further comprising:

a metal box (10), in particular made from aluminium, said metal box surrounding a process chamber and comprising a closable opening for inserting a semiconductor substrate;

a substrate holder (14a) disposed in the process chamber for holding a semiconductor substrate (15);

at least one isolator tube (11) disposed in the process chamber;

wherein the at least one electrode (21, 22, 23) is arranged at least partially in said at least one isolator tube (11) such that at least said further portion (32) is received therein, wherein the coaxial outer conductor may be arranged such that the opening in the coaxial outer conductor extends beyond the edge region of a substrate (15) received on said substrate holder;

at least one inlet opening (18) in said metal box (10) for introducing process gas into the process chamber; and at least one outlet opening (19) in said metal box (10) for exhausting process gas from the process chamber.

8. The device of claim 7, further comprising a vacuum pump connected to the outlet opening (19), said vacuum pump being capable of adjusting the pressure of the process gas in the process chamber preferably to a pressure of from 1 mTorr to 20 Torr.

9. The device of claim 7, wherein the substrate holder (14a) is rotatably disposed in the process chamber, and/or adjustable in height to vary the distance between the substrate holder and the isolator tube (11) and/or is coolable and/or heatable and/or is made at least partially from one or more of the following materials: aluminum nitride, silicon nitride, quartz and sapphire.

10. The device of claim 7, comprising a plurality of isolator tubes (11) in the process chamber, which isolator tubes are arranged substantially parallel in at least one plane above and/or below the substrate holding region, wherein each isolator tube (11) surrounds the at least one further region (32) of a respective one of said at least one electrode (21, 22, 23), wherein the microwave radiation power of the electrodes (21, 22, 23) may be controllable separately and/or group wise in an open loop and/or closed loop manner and wherein adjacent electrodes (21, 22, 23) are optionally connected with the respective microwave source (20) on opposite sides of their respective isolator tube (11).

11. The device of claim 7, further comprising heating elements, which are arranged below and/or above the substrate holding region, said heating lamps preferably being halogen lamps and/or arc lamps, and/or wherein said heating elements are separated from the process chamber by quartz glass and/or quartz glass doped with impurity atoms.

12. The device of claim 7, wherein an isolator plate (25) is arranged at the upper side of the metal box such that the contact between a plasma generated by the microwave plasma device and the metal wall is prevented, and/or wherein the metal box (10) comprises surface regions facing the process chamber which are made from anodized aluminium and/or wherein the device comprises a further electrode (26), which is arranged in the process chamber, spaced from the metal box (10) and above the substrate holding region, which further electrode (26) being optionally connected to the isolator plate (25).

13. A method for processing a semiconductor substrate comprising the following steps:
a) providing a microwave plasma device comprising at least one electrode (21, 22, 23) which is connectable to a microwave generator (20), wherein the at least one electrode (21, 22, 23) comprises a coaxial inner conductor (21) made from electrically conductive material as well as a coaxial outer conductor (22) made from electrically conductive material, which at least partially surrounds the coaxial inner conductor and is spaced therefrom, wherein the coaxial outer conductor (22) comprises in its longitudinal direction at least one first region (31), in which the coaxial outer conductor completely surrounds the coaxial inner conductor, and at least one further region (32), in which the coaxial outer conductor is formed such that it tapers or narrows, in particular in a constant manner, from said first region (31), and thus surrounds the coaxial inner conductor (21) less and less, such that microwave radiation generated by the microwave generator (20) may exit from the at least one further region (32) substantially perpendicular to the longitudinal axis of the coaxial inner conductor (21), when the at least one electrode (21, 22, 23) is connected to the microwave generator (20);
b) providing a metal box (10), in particular made from aluminium, surrounding a process chamber and comprising a closable opening for inserting a semiconductor substrate, wherein a substrate holder (14a) is disposed in the process chamber for holding a semiconductor substrate (15) and at least one isolator tube (11) is disposed in the process chamber, the at least one electrode (21, 22, 23) being arranged at least partially in said at least one isolator tube (11) such that at least said further portion (32) is received therein, wherein the coaxial outer conductor may be arranged such that the opening in the coaxial outer conductor extends beyond the edge region of the substrate (15) received on said substrate holder, wherein at least one inlet opening (18) is provided in said metal box (10) for introducing process gas into the process chamber and at least one outlet opening (19) is provided in said metal box (10) for exhausting process gas from the process chamber;
c) Inserting the semiconductor substrate into the process chamber and placing the semiconductor substrate on the substrate holder disposed in the process chamber;
d) Closing the closable opening of the process chamber;
e) Evacuating the process chamber;
f) Introducing a process gas into the process chamber;
g) Introducing microwave radiation via the electrodes (21, 22, 23) of the microwave plasma device into the process chamber and generating microwave plasma in the process chamber;
h) Switching off the microwave radiation;
i) Venting the process chamber;
j) Opening the closable opening of the process chamber; and
k) Removing the semiconductor substrate from the process chamber.

14. The method of claim 13, wherein said semiconductor substrate is heated to a predetermined temperature, preferably below 700° C., in said process chamber before and/or during and/or after the step of Introducing microwave radiation into the process chamber and or wherein the process gas includes at least one gas selected from the following group: argon, helium, oxygen, hydrogen, nitrogen, deuterium, and/or nitrous oxide or a mixture from these gases and/or $NF_3$, $CF_4$, $Cl_2$ or a mixture of these gases.

* * * * *